United States Patent [19]
Stevens et al.

[11] 3,947,776
[45] Mar. 30, 1976

[54] INDUCTIVE LOAD DRIVER WITH FAST SWITCHING CAPABILITY

[75] Inventors: Daniel A. Stevens, Arnold; John Logis, Jr., Severna Park; Ronald C. Scheerer, Baltimore, all of Md.

[73] Assignee: The United States of America as represented by the Secretary of the Air Force, Washington, D.C.

[22] Filed: Oct. 22, 1974

[21] Appl. No.: 516,936

[52] U.S. Cl. .............. 328/147; 328/152; 328/175; 307/235 N; 307/230; 307/270
[51] Int. Cl.² .............. H03K 5/20; H03K 3/00
[58] Field of Search .............. 328/147, 152, 175; 307/230, 235 N, 235 T, 229, 270

[56] References Cited
UNITED STATES PATENTS

| | | | |
|---|---|---|---|
| 3,346,846 | 10/1967 | Ferguson et al. | 307/235 N |
| 3,531,726 | 9/1970 | Whigham | 328/147 |
| 3,697,780 | 10/1972 | Michael et al. | 307/235 N |
| 3,866,063 | 2/1975 | Long | 307/230 |

*Primary Examiner*—John S. Heyman
*Attorney, Agent, or Firm*—Joseph E. Rusz; William Stepanishen

[57] ABSTRACT

An inductive load driver apparatus utilizing a current feedback loop having two switchable signal paths to provide the fast switching capability to drive the ferrite phase shifters on the AWACS antenna.

5 Claims, 3 Drawing Figures

INDUCTIVE LOAD DRIVER WITH FAST SWITCHING CAPABILITY

BACKGROUND OF THE INVENTION

The present invention relates broadly to operational amplifiers and in particular to an inductive load driver apparatus with fast switching capability.

In the prior art, operational amplifiers with push-pull output stages and a sensing resistor feedback configuration are used quite extensively in electronic design as current amplifiers. Generally, such operational amplifiers comprise an I.C. operational amplifier, a push-pull output stage and a precision type sensing resistor. The sensing resistor voltage E$s$ is controlled by the magnitude of the input voltage E$in$ and the closed loop gain of the network. With the load placed in series with the sensing resistor R$x$, the standard voltage amplifier has been converted to a current amplifier with the current in the load directly proportional to the voltage developed across the sensing resistor. The output current in this circuit is given by the relationship $I_o$ = Ein A/R$s$ where A is the magnitude of the closed loop gain of the amplifier and Rs is the ohmic value of the sensing resistor. If precision type resistors are used for those components whose ohmic values enter into the above equation, then an accurate current amplifier will be obtained.

The prior art circuit works quite well as long as the load is purely resistive and no major limitations are encountered. However, when driving an inductive load, there are other factors to consider which makes the task more difficult. One of the primary limitations is how fast can the current through the load be changed. The basic limitation comes from the L$di/dt$ of the coil, or more specifically the magnitude of the power supplies in the output stage. The most obvious solution to this problem is to use higher voltage power supplies. However, this soon gets out of hand due to the added stress on the components and the power that is wasted when the circuit is operated in a steady state. The basic problems involved in driving inductive loads can be summarized as follows:

1. Increase complexity in driver and power supply design.
2. Highly stressed components cause a decrease in reliability and an increase in total system cost.
3. Means of dissipating power to maintain components at a safe operating temperature.
4. Waste in the power consumption because the high voltage supplies are only needed for fast switching capability. The present invention provides an inductive load driver apparatus which is capable of operating the circuit from lower values supplies in the steady state, and switching to the higher values supplies during the times when the fast switching capability is needed.

SUMMARY

The present invention utilizes two paths of signal flow: one for steady state operation, and one to allow for the fast switching. The inductive load driver apparatus is the standard feedback arrangement, with the load in series with a precision sensing resistor, and the voltage across this sensing resistor fedback to the input to close the loop. With the configuration, as before, the voltage developed across the sensing resistor is proportional to the current in the load. The inductive load drive apparatus includes a buffer and bias network that is required because of the fast switching feature. The second path bypasses the buffer and bias circuitry and the output stage and goes through the threshold detector and the high voltage pulser stage.

It is one object of the invention, therefore, to provide an improved inductive load driver apparatus that conserves power.

It is yet another object of the invention to provide an improved inductive load driver apparatus that can provide a fast switching capability in the order of 450 $\mu$ sec.

It is still another object of the invention to provide an improved inductive load driver apparatus capable of dissipating power to maintain components at safe operating levels and temperature.

These and other advantages, features and objects of the invention will become more apparent from the following description taken in connection with the illustrative embodiment in the accompanying drawings.

DESCRIPTION OF THE PREFERRED EMBODIMENT

Figure 1:
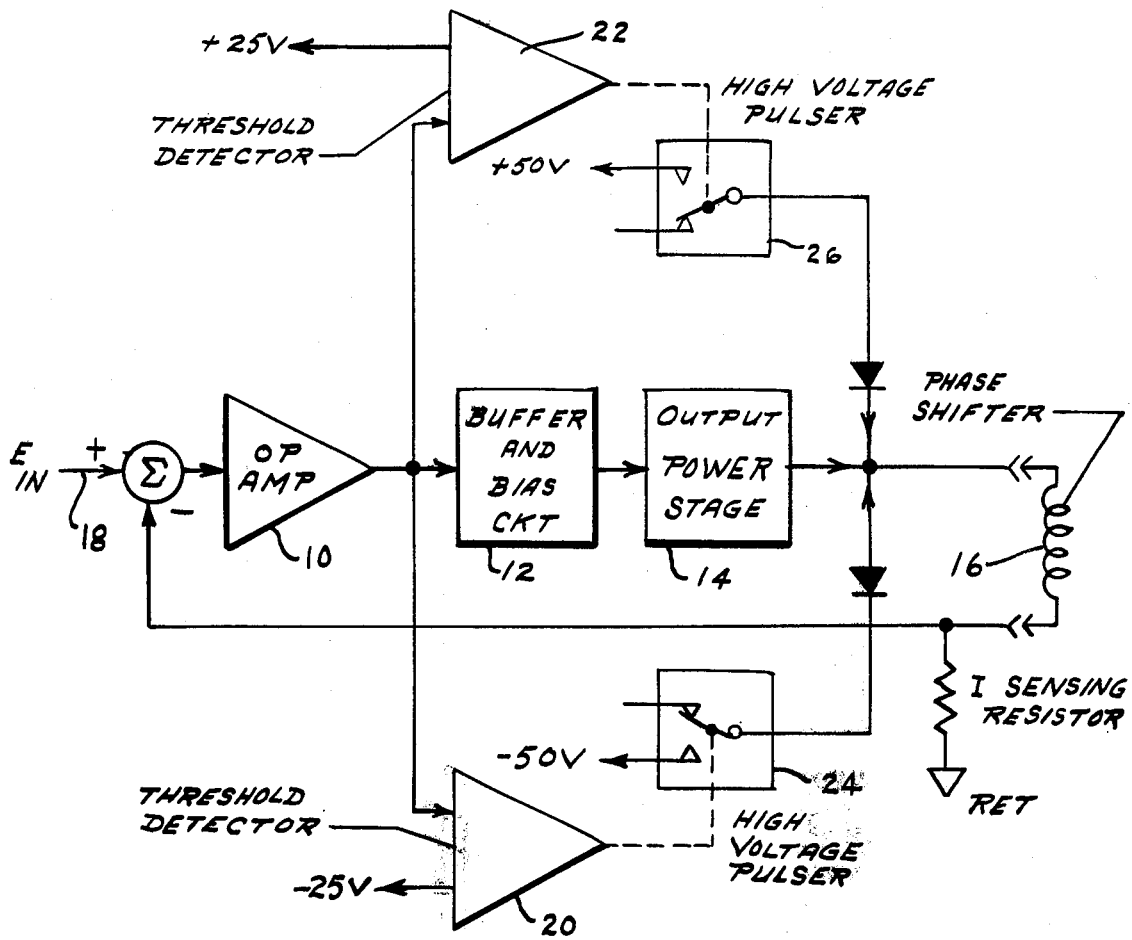
FIG. 1 is a block diagram of the inductive load driver apparatus in accordance with the present invention.

Referring now to FIG. 1, there is shown an inductive load driver apparatus utilizing an operational amplifier 10 in conjunction with buffer and bias unit 12 and output power stage 14 to drive phase shifter 16. In order to better understand how the circuit operates, consider a step command applied to the input 18 to reset the current in the load to some new value. As the input changes with a fast rise time from one level to another, the output isn't able to slew as fast because of the L$di/dt$ of the coil 16 and the operational amplifier goes into saturation. Normally it would stay saturated until the current in the coil 16 obtained the desired value, at such time the circuit would once again operate in the closed loop configuration. However, when the feedback path is opened and the operational amplifier saturates at either a positive or negative level, either threshold detector circuit 20,22 is triggered. This in turn switches in the respective high voltage supply 24,26 and causes the current in the coil 16 to change at a faster rate. Once the current in the coil 16 reaches the desired level, the closed loop configuration takes over and the high voltage supplys 24,26 are removed because the threshold level is no longer exceeded. This scheme basically accomplishes two things: 1) decreased the switching time; and 2) reduced the power consumption.

Figure 3:
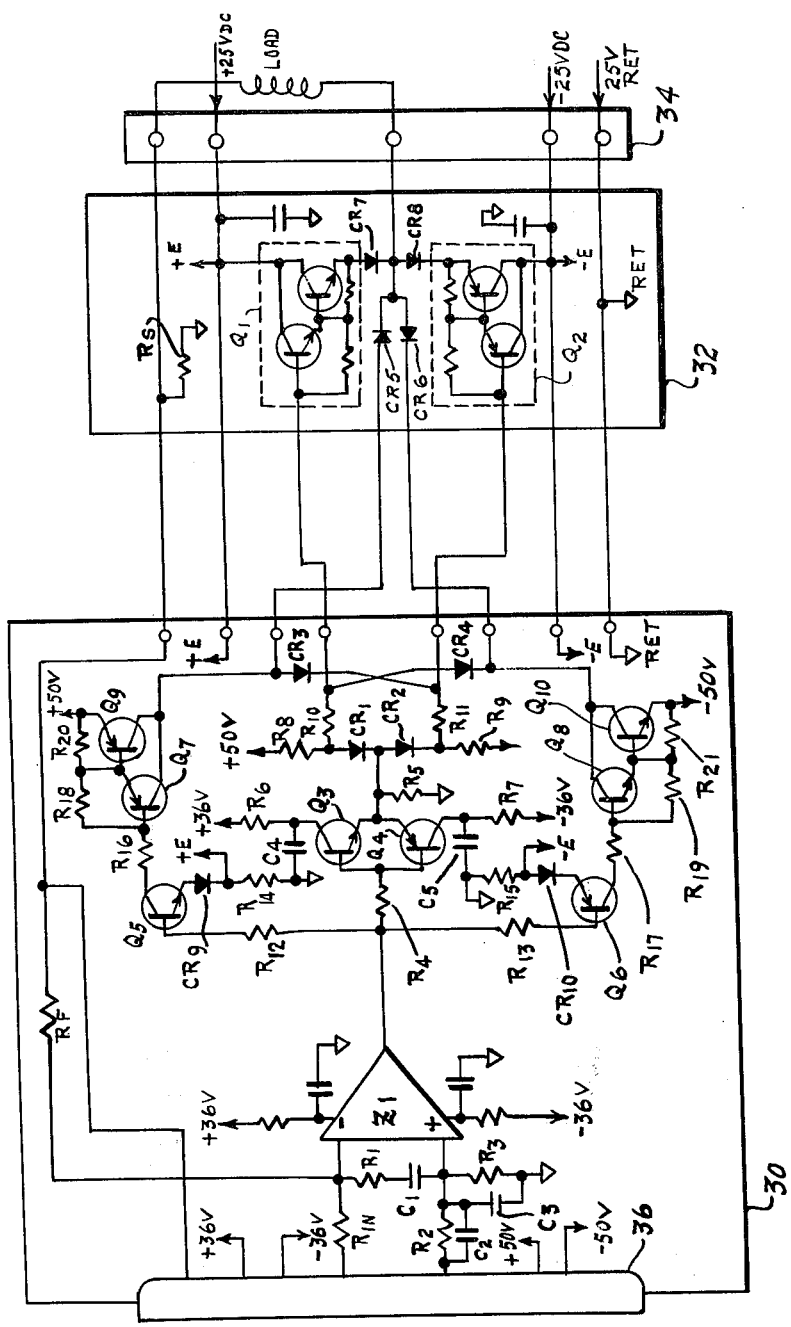

The block diagram of FIG. 1 has been mechanized by the circuitry shown in FIG. 3. The overall circuit consists of a printed circuit board assembly 30 (containing the majority of components which are of low power dissipation) and a heat sink assembly 32 (to provide a way to dissipate the higher power associated with the output stage). The total assembly is bolted to the phase shifter, whose temperatures may be accurately controlled by circulating FC77 coolant through the unit. The high current supplies as well as the connections for the coil are brought in through a terminal strip 34 while the other supplies and the input signal come in through the board connector 36.

In FIG. 3 the resistors R$in$, R$f$, R4 and R$_s$ operational amplifier, Z$^1$, and transistor assemblies Q1 and Q2 make up the basic feedback amplifier configuration of FIG. 1. The buffer stage is comprised of transistors Q3 and Q4, resistors R5, R6 and R7, and capacitors C4 and C5 and is simply a NPN/PNP emitter follower. The bias network which is needed because of the high voltage pulsor circuits, is made up of resistors R8, R9, R10 and R11 and diodes CR1 and CR2. The two diodes in the bias network serve a dual role by reducing the cross-over distortion and blocking when the high voltage pulsers are on. Under steady state operation this much of the circuit functions as previously described with the output current given by the relationship $|I_o| = $ E$in$ R$f$/R$in$ R$s$.

Figure 2:
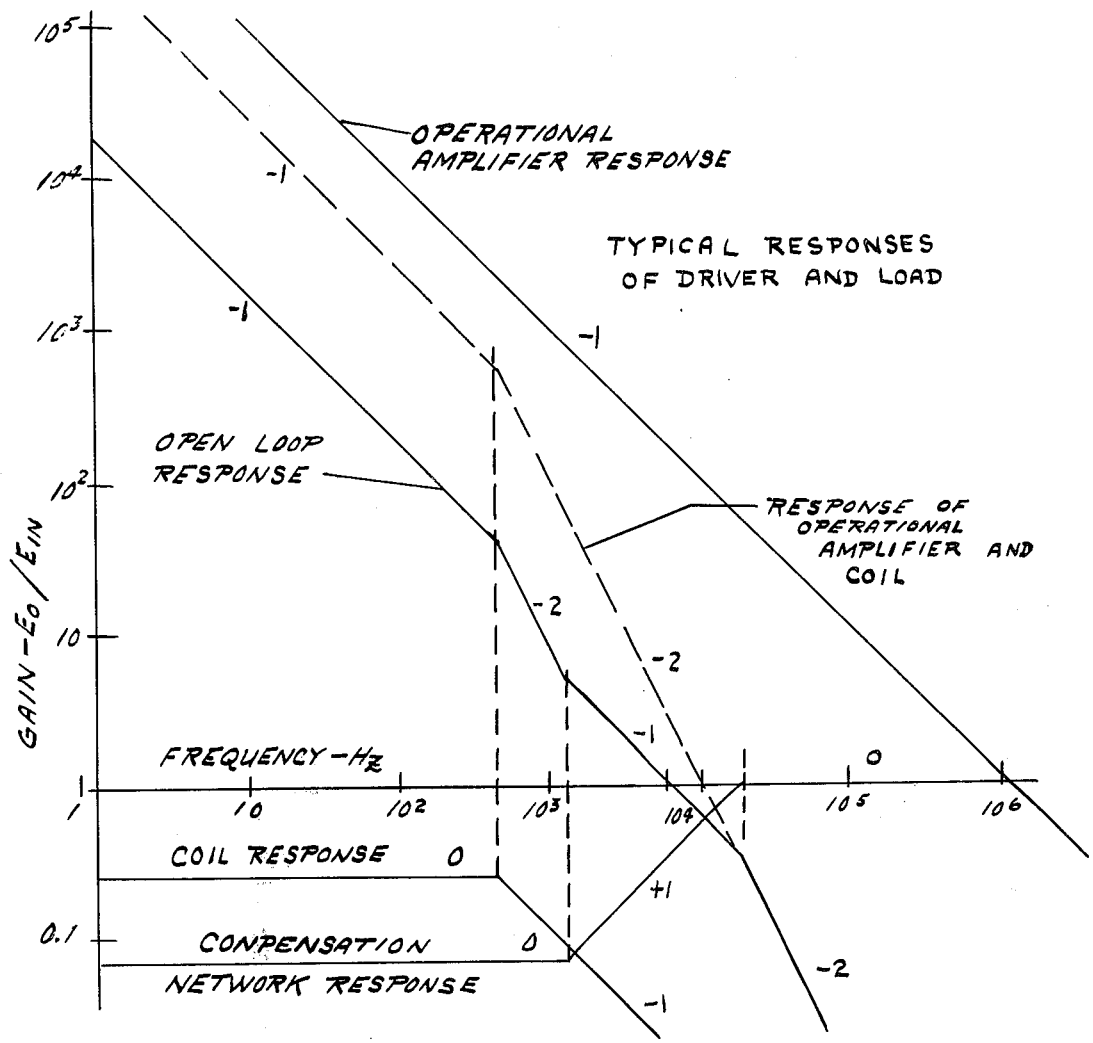
FIG. 2 is a graphical representation of the operational amplifier responses, and, FIG. 3 is a schematic diagram of the phase shifter driver.

The input network will be discussed in greater detail in order to better understand the invention and to see what it accomplishes in the driver. The first thing about the input network is that it is double-ended. This technique is used to cancel out any potential differences that might be present in the signal return between where the input is generated and the input to the driver. The compensation network, made up of the various resistors and capacitors in the front end, shapes the overall gain/frequency response to give a stable system with maximum bandwidth for a fast switching capability. It may be seen from FIG. 2 that the response plot of the coil has an initial corner at approximately 2 KHz and that it rolls off from this point with a (−) 1 slope. This (−) 1 slope, when combined with the (−) 1 slope of the open loop response of the operational amplifier, will yield an overall response that crosses unity gain with a (−) 2 slope and the system is only conditionally stable. What is wanted through the compensating network is to introduce a (−) 1 slope into the response so that the gain/frequency plot will continue to roll off with a (1) slope until it crosses unity gain. In this way a stable response is guaranteed. Component values were calculated with this fact in mind, and at the same time an effort was made to get maximum bandwidth. The various responses, for the coil, the op amp, the compensating network and the combined responses, can be also seen in FIG. 2. It should be noted in that the network between the two inputs of the operational amplifier could have been purely resistive, but this would have increased the DC offset of the driver. To get around this situation and still maintain the capability of shaping the overall response, an R-C network is substituted for the resistor between the two inputs to the op amp. In this way the network doesn't affect the op amp from a DC standpoint, but merely contributes a low frequency pole/zero pair to the already existing pole and zero of compensating network. These low frequency corners occur at approximately 3 Hz and 20 Hz and are several decades removed from the main corners as to have neglegible effect in the overall response. The zero/pole combination for the lead-lag network occurs at approximately 1.5 KHz and 12 KHz respectively. This technique for compensation yields a closed loop bandwidth of approximately 5 KHz.

Returning now to FIG. 3 the circuitry that is employed to give the driver the fast switching capability will be dealt with. The threshold detectors comprise transistors Q5 snd Q6, resistors R12, R13, R14 and R15, and diodes CR9 and CR10. Either one or the other of these detectors will be energized depending on whether the input is switching from plus to minus or from minus to plus. Under steady state operation the output voltage from the operational amplifier is such that neither Q5 or Q6 is conducting. Each of the threshold detectors is used to drive a high voltage pulser, one for positive voltage and the other for negative voltage. These pulser networks are basically a pair of darlington stages that are operated in an inverted configuraton. Diodes CR3, CR4, CR5, CR6, CR7 and CR8 function as steering/blocking diodes to allow the application of the high voltage to the coil and at the same time protect other portions of the circuit from being damaged by the higher voltage.

In order to get a better understanding of how the combined circuits operate, a step by step description of the operation of the disclosed circuit will be given. In steady state operation, a slow varying signal is applied to the input and the circuit functions as a standard feedback amplifier. Under this condition the voltage gain is approximately −R$f$/R$in$ and the current in the coil is given as $|I_o| = $ E$in$ R$f$/R$in$ R$s$. Assume that the input signal is at some positive level and a fast falling step occurs to command the driver to reset the current in the coil to some new positive level. Because of the L$di/dt$ of the coil, the output of the driver cannot slew as fast as the input, the feedback loop is opened and the operational amplifier saturates at its positive saturation level. This saturation level of the operational amplifier is greater than the threshold level established on transistor Q5 and thus causes Q5 to conduct. This in turn causes the darlington pair Q7 and Q9 to conduct, applying approximately +50 VDC to the junction of steering diodes CR3 and CR5. Diode CR5 allows the application of the +50 VDC directly to the coil, which causes the current to switch in a shorter time period. While this is occuring, some measures must be taken to insure that other components in the circuit are not stressed beyond their maximum ratings. The first measure for protection was the addition of diode CR7. In steady state operation, this diode is forward biased and allows positive current flow to the coil from transistor Q1. When the high voltage is applied directly to the coil from the pulser network, this diode then prevents the base-emitter junction of Q1 from being reverse biased past its maximum rating. It should be noted that transistor Q2 is also non-conducting at this time because its base and emitter are essentially at the same voltage potential. By looking at the bias network, we can see the importance of having diodes CR1 and CR2. With the operational ampifier saturated, the voltage level at the emitters of Q3 and Q4 is approximately at this same level. The voltage at the junction of resistors R9 and R11 is approximately +50 VDC and diode CR2 is reverse biased. This diode not only protects transistors Q3 and Q4 when the pulser circuitry is on, but also the operational amplifier. These diodes also serve in another capacity when the circuit is operating in the standard feedback configuration. They insure that only one of the output transistors will be conducting at the same time by reverse biasing the base-emitter junction of the other transistor. It should be pointed out that the above description applies to resetting the current in the coil from some negative level to some positive level. When the opposite condition exists, the negative threshold detector and high voltage pulser circuits are now energized. The operation of the driver at this time is identical to that which has already been described except that in the description the corresponding components will be referenced. For example: when the positive pulser was energized, it was said that diode CR1 in the biasing network was conducting while CR2 was reverse biased; for the case when the negative pulser is conducting, diode CR2 will be conducting and CR1 will be reverse biased.

After the current in the coil reaches the desired level, the close loop operation once again takes control, the high voltage pulser is deenergized and the driver functions as a standard feedback amplifier. It continues to function in this steady state mode until the next reset command is generated, at which time either one or the other high voltage pulsers will be actuated to give the fast switching capability.

TEST RESULTS

A prototype model of the present invention was built in April of 1971 and tested using an actual shifter as the load. The characteristic impedance of the coil of the phase shifter was 2.2 millihenries inductance and 5 ohms resistance. The maximum differential current to be switched was 7.2 amperes. The present invention was compared with the standard feedback current amplifier and the following results were obtained: 1) the switching time for the maximum value of differential current was reduced from 650 $\mu$sec to 450 $\mu$sec; and 2) the average power dissipation, based on the same switching time, was reduced by a factor of ½. The actual closed loop response of the disclosed circuit agreed favorably with calculated values and the actual close loop bandwidth was measured as 4.5 KHz. All theoretical assumptions used in the initial design were proven valid during test and the disclosed circuit functioned as was anticipated.

Although the invention has been described with reference to a particular embodiment, it will be understood to those skilled in the art that the invention is capable of a variety of alternative embodiments within the spirit and scope of the appended claims.

What is claimed is:

1. An inductive load driver apparatus with fast switching capability comprising in combination:

a feedback current amplifier having an input signal, said feedback current amplifier receiving a feedback signal from the load, said feedback signal being summed with said input signal to provide an output signal to said load, and, means for driving an inductive load connected to said feedback current amplifier to sense said output signal, said inductive load driving means generating a control signal in response to said output signal, said inductive load driving means applying a high voltage output signal to said load in response to said control signals, said inductive load driving means comprises in combination:

first and second threshold detectors connected to said feedback current amplifier to receive said output signal, said first and second threshold detectors having first and second predetermined threshold levels respectively, said first and second threshold detectors providing first and second control signals, respectively, and first and second high voltage pulsers connected respectively to said first and second threshold detectors, said first and second high voltage pulsers being activated by said first and second control signals respectively, said first high voltage pulser being responsive to said first control signals to provide a first high voltage to said load, said second high voltage pulser being responsive to said second control signal to provide a second high voltage to said load.

2. An inductive load driver apparatus as described in claim 1 wherein said first predetermined level is at least +25 volts.

3. An inductive load driver apparatus as described in claim 1 wherein said second predetermined level is at least −25 volts.

4. An inductive load driver apparatus as described in claim 1 wherein said first high voltage is at least ;50 volts.

5. An inductive load driver apparatus as described in claim 1 wherein said second high voltage is at least '50 volts.

* * * * *